United States Patent [19]
Yanagida et al.

[11] Patent Number: 5,113,241
[45] Date of Patent: May 12, 1992

[54] SEMICONDUCTOR DEVICE MOUNTED UPON AN INSULATING ADHESIVE WITH SILICON DIOXIDE AND NICKEL CHROMIUM STEEL FILLING PARTICLES

[75] Inventors: Satoru Yanagida, Kawasaki; Kouji Araki, Yokohama; Hikaru Okunoyama; Tetsunori Niimi, both of Kawasaki, all of Japan

[73] Assignee: Kabushiki Kaisha Toshba, Kawasaki, Japan

[21] Appl. No.: 627,573

[22] Filed: Dec. 14, 1990

[30] Foreign Application Priority Data

Dec. 14, 1989 [JP] Japan ................................. 1-324753

[51] Int. Cl.⁵ ..................... H01L 23/28; H01L 23/16; H01L 39/02
[52] U.S. Cl. ........................................ 357/72; 357/75; 357/80
[58] Field of Search .............. 357/72, 74, 81, 80, 357/75, 91, 65, 68; 437/196, 228, 946

[56] References Cited

U.S. PATENT DOCUMENTS

| | | | |
|---|---|---|---|
| 3,753,056 | 8/1973 | Cooke | 357/75 |
| 4,739,389 | 4/1988 | Goedbloed | 357/75 |
| 4,907,068 | 3/1990 | Amann et al. | 357/75 |
| 4,984,065 | 1/1991 | Sako | 357/75 |

*Primary Examiner*—Andrew J. James
*Assistant Examiner*—Carl Whitehead, Jr.
*Attorney, Agent, or Firm*—Foley & Lardner

[57] ABSTRACT

A semiconductor device comprises a plurality of pellets fixed on a bed by a conductive adhesive agent, an insulating substrate having a junction wiring fixed on the bed between the semiconductor pellets, and wires for connecting the pellets and insulating substrate. The insulating substrate is fixed on the bed by an insulating adhesive agent including filling material such as particles of silicon dioxide and metal particles. The surfaces of the filling material particles are coated with an oxide film.

5 Claims, 1 Drawing Sheet

SEMICONDUCTOR DEVICE MOUNTED UPON AN INSULATING ADHESIVE WITH SILICON DIOXIDE AND NICKEL CHROMIUM STEEL FILLING PARTICLES

BACKGROUND OF THE INVENTION

This invention relates to a semiconductor device and a method of manufacturing the same, and more particularly, to a semiconductor device in which an insulating substrate is mounted, in addition to a semiconductor pellet, on a bed of a lead frame, and a method of manufacturing such a semiconductor device.

In semiconductor devices, only one semiconductor pellet is ordinarily mounted on the bed of the lead frame. However, due to recent marketing demands, there have been many cases where a plurality of pellets are mounted within a single semiconductor device.

In such devices, for example, two semiconductor pellets are fixed on the bed of the lead frame by means of a conductive adhesive agent. Respective pads and inner leads of these pellets are connected through wires by wire bonding. In addition, it is required, in this case, to connect two pellets to each other.

However, when pellets are directly connected to each other by wire bonding, there is the possibility that the pads of the pellets may be damaged, and respective arrangements on the bed may be restricted. In view of this, an approach is employed to fix, on the bed between two pellets, an insulating substrate on which a wiring pattern is formed, to thus implement wire bonding to the two pellets through the insulating substrate.

In the case of fixing the insulating substrate onto the bed, an insulating adhesive agent was conventionally used. The insulating adhesive agent used here is mainly comprised of an epoxy resin including about 20% of silicon dioxide ($SiO_2$) as a filling material. In addition, an additive agent is included therein. The percentage content of the filling material is generally selected to be between about 20% to 40% depending on the solubility of the silicon dioxide filling material into the epoxy resin.

However, when the filling rate is a low value of 20 to 40%, the hardness after hardening is disadvantageously insufficient when compared to that of typical silver (Ag) paste.

Furthermore, the epoxy resin has a characteristic such that its hardness is lowered at a high temperature because it is apt to be affected by temperature. For this reason, although it is required to essentially carry out wire bonding at a high temperature of about 270° C., wire bonding using the above-mentioned insulating adhesive agent must be carried out at a temperature lower than 150° C., resulting in the problem that a sufficient bonding strength between the wires and the insulating substrate cannot be provided.

In addition, in the case of an adhesive agent having a filling rate of less than about 60%, it is confirmed that there is apt to occur a bleed phenomenon such that such an adhesive agent goes round on the surface of the insulating substrate during the process of hardening. When the bleed phenomenon occurs, there are instances where the adhesive agent may adhere to pads on the insulating substrate. Thus, the wire bonding ability or characteristic is also considerably deteriorated.

As stated above, an insulating adhesive agent having a low filling rate was used from a viewpoint of solubility. However, the employment of such an adhesive agent disadvantageously results in insufficient hardness of the adhesive agent, and lowered wire bonding ability. As a result, high reliability cannot be provided.

SUMMARY OF THE INVENTION

Accordingly, an object of this invention is to provide a semiconductor device which can provide a sufficient hardness even at a high temperature after hardened, has an excellent wire bonding ability, and has a high reliability, and a method of manufacturing such a semiconductor device.

According to this invention, there is provided a semiconductor device comprising:

a plurality of pellets fixed on a bed by means of a conductive adhesive agent, an insulating substrate having a junction wiring, fixed on the bed between the semiconductor pellets, and wires for connecting the plurality of semiconductor pellets and the insulating substrate therebetween, the insulating substrate being fixed on the bed by an insulating adhesive agent including, as a filling material, particles of silicon dioxide and metal particles of which surfaces are coated with an oxide film.

There is also provided a method of manufacturing a semiconductor device comprising the steps of:

fixing a plurality of semiconductor pellets on a bed by means of a conductive adhesive agent, fixing an insulating substrate having a junction wiring on the bed between the plurality of semiconductor pellets by means of an insulating adhesive agent including, as a filling material, particles of silicon dioxide and metal particles of which surfaces are covered with an oxide film, and connecting the semiconductor pellets and the insulating substrate by means of wires.

In accordance with this invention, since not only silicon dioxide but also metal particles of which surfaces are coated with an oxide film are used as a filling material or agent for an insulating adhesive agent, such metal particles come into gaps between silicon dioxide particles to increase the filling rate. In addition, the temperature characteristic at high temperatures is improved, and the strength is also improved.

DESCRIPTION OF THE PREFERRED EMBODIMENT

A manufacturing method according to an embodiment of this invention and a semiconductor device provided by this manufacturing method will now be described with reference to the attached drawings.

Figure 1:
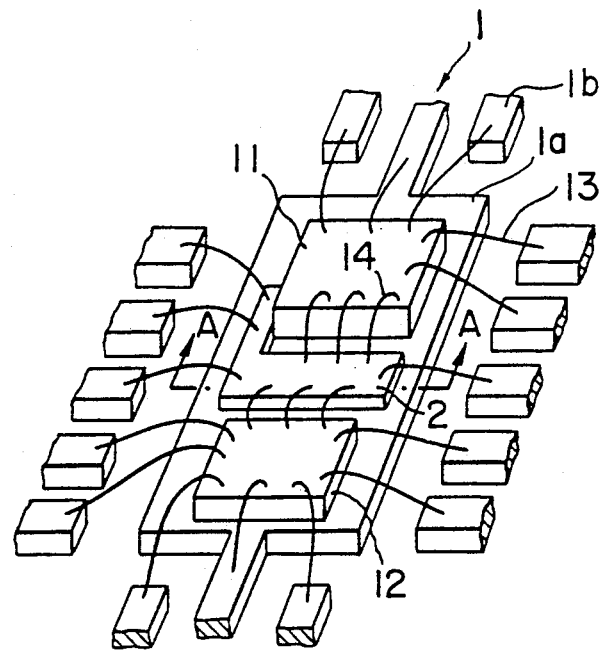
FIG. 1 is a perspective view showing an intermediate assembly state of a semiconductor device to which this invention is applied.

FIG. 1 is a perspective view showing a semiconductor device to which this invention is applied. On a bed 1a of a lead frame 1, two semiconductor pellets 11 and 12 are fixed by a conductive adhesive agent. These pellets 11 and 12 and inner leads 1b are connected through wires 13. An insulating substrate 2 on which a wiring pattern is formed is fixed on the bed between both pellets. These pellets are connected by wires 14 through the insulating substrate 2.

Figure 2:
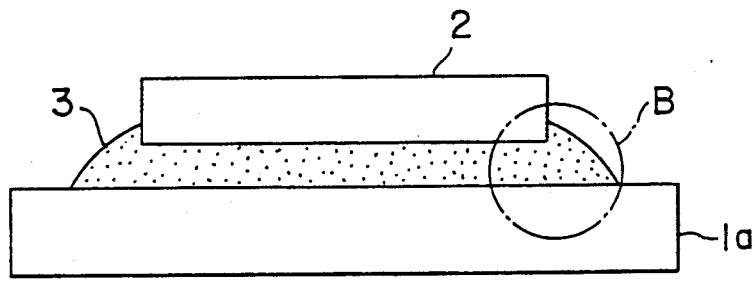
FIG. 2 is a cross sectional view taken along the line A—A of FIG. 1.
Figure 3:
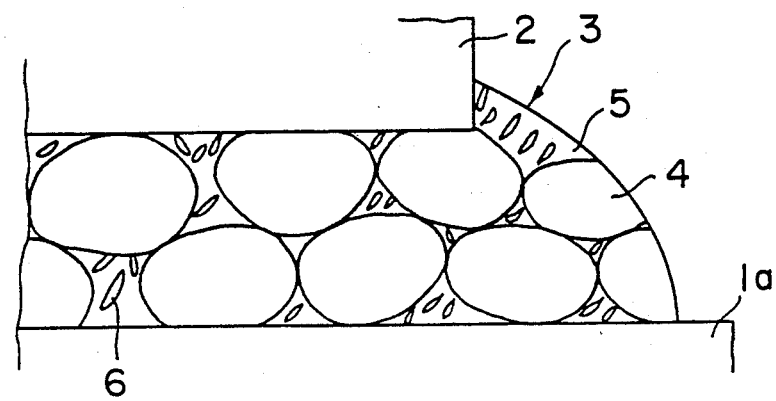
FIG. 3 is a partial enlarged portion of the portion A in FIG. 2.

FIG. 2 is a longitudinal cross sectional view along the line A—A of FIG. 1 showing the state where the insulating substrate 2 is fixed on the bed 1a of the lead frame 5 by using an insulating adhesive agent 3. FIG. 3 is a partial enlarged view of the portion A of FIG. 2. In this embodiment, as the filling material for the insulating adhesive agent 3, nickel-chromium (Ni-Cr) steel 6 is used in addition to silicon dioxide 4. An epoxy mold resin 5 surrounds these filling materials. The size of particles of silicon dioxide 4 is 10 μm in average, and the size of particles of Ni-Cr steel 6 is 2 μm smaller than that of the silicon dioxide particles. Accordingly, particles of Ni-Cr steel 6 are placed in the state where they come into gaps between particles of silicon dioxide Further, since the Ni-Cr steel 6 has a specific gravity larger than that of silicon dioxide 4, it is possible to improve a filling rate with relative ease by stirring or mixing.

Since not only silicon dioxide but also metal are included in the insulating adhesive agent, the percentage content of the filling material is increased, resulting in improved hardness after hardening. In the case where only silicon dioxide is included as the filling material, the solubility is lowered if the filling rate is excessively increased. Accordingly, the filling rate must be held down to 40% or less, leading the insufficient hardness. However, by further including metal, it is possible to improve hardness without lowering the solubility.

Further, in the case where epoxy mold resin is used as the resin component of the adhesive agent, since the hardness is lowered at a high temperature if the filling rate is low, wire bonding must be carried out at a temperature lower than an optimum temperature, resulting in lowered wire bonding ability. However, the wire bonding ability can be improved by increasing the filling rate.

Furthermore, if the filling rate is low, the bleed phenomenon is apt to be produced at the process of hardening, so the adhesive agent may adhere to the pads of the insulating substrate, resulting in a deteriorated wire bonding ability. However, by further including metal to increase the filling rate, it is possible to prevent occurrence of such a phenomenon.

Further, since the oxide film is formed on the surface of metal, insulating ability is maintained, resulting in no possibility of leakage As metal, Ni-Cr steel may be used. Since such a metal has a specific gravity larger than that of silicon dioxide, the filling rate is improved by stirring.

In addition, in the case where the size of particles of metal is smaller than that of particles of silicon dioxide, since metal particles come into gaps between particles of silicon dioxide, the filling rate can be further improved.

The results obtained by comparing the semiconductor device according to this embodiment with the conventional device will now be described. In the conventional device, only silicon dioxide of 30% is included. In the first embodiment, circular particles of Ni-Cr steel are included in addition to silicon dioxide, thus allowing the filling rate to be 60% as a whole. Further, in the second embodiment, Ni-Cr steel in the form of flakes is included, thus allowing the filling rate to be 72%. In all the cases of the conventional device, and the first and second embodiments of this invention, a wire having a diameter of 25 μm was used in wire bonding. Wire bonding is carried out at a temperature of 150° C. in the conventional device, and was carried out at a temperature of 250° C. in the first and second embodiments.

Tests described below were conducted in connection with respective devices thus obtained.

(1) Hardness of an adhesive agent at an ordinary temperature and high temperature (250° C.) was measured by using Shore D tester.

(2) After wire bonding (1600 wires in each case) was conducted, the number of pads on the semiconductor pellet side where wire bonding failure was observed was examined.

(3) A shearing force was applied to balls of wires on the semiconductor pellet side to measure strength when they were peeled to determine an average peeling strength.

(4) The wire number of pads on the insulating substrate side where bonding failure was observed was examined.

(5) A tensile force was applied to the wire to measure a bonding strength of the wire in the insulating substrate to determine an average bonding strength.

(6) Whether or not a bleed phenomenon took place in the middle of hardening of the adhesive agent was examined.

TABLE

| | PRIOR ART | 1st EMBODIMENT | 2nd EMBODIMENT |
|---|---|---|---|
| Filling material percentage rate | 30% | 60% | 72% |
| Hardness (ordinary temperature) | D72 | D92 | D95 |
| Hardness (250° C.) | D20 | D60 | D75 |
| No. of pads provided with wire bonding failure (pellet side) | 123 | 0 | 0 |
| Average peeling strength | 38 g | 70 g | 70 g |
| No. of pads provided with wire bonding failure (insulating substrate side) | 324 | 0 | 0 |
| Average tensile strength | 4.5 g | 7.2 g | 8.3 g |
| Bleed phenomenon | Observed | Observed to some degree | Non-observed |
| Over-all judgement | No good | Good | Excellent |

As is clear from the above-mentioned test result, since the semiconductor device according to this embodiment has a high percentage content of the filling material, the hardness, particularly at high temperatures, is improved to much extent. Since the second embodiment includes particles of Ni-Cr steel in the form of flake, such particles of Ni-Cr steel are apt to come into gaps between particles of silicon dioxide to more extent than in the first embodiment including circular particles of Ni-Cr steel. As a result, the filling rate is improved and the hardness is further improved.

Further, since hardness at a high temperature is improved to a large extent, wire bonding can be carried out at a temperature suitable for wire bonding of 250° C. in the first and second embodiments. As a result, wires were securely bonded to all the pads. Moreover, the bonding force is improved, and the average peeling strength and the average tensile strength about 1.8 times larger than those in the prior art were both provided. In addition, the occurrence of the bleed phenomenon could be also prevented. This also contributes to an improvement in the wire bonding ability.

The above-described embodiments are all of illustrative nature, and therefore does not limit this invention. While Ni-Cr steel is filled in all the embodiments, other metals including an oxide film formed thereon and capable of maintaining the insulating property may be used. For example, chromium (Cr), manganese (Mn), molybdenum (Mo), tin (Sn), or the like may be used. In addition, while epoxy resin is representative as the resin component, other resins may also be used.

What is claimed is:

1. A semiconductor device comprising:
   a plurality of pellets fixed on a bed by means of a conductive adhesive agent,
   an insulating substrate having a junction wiring, fixed on said bed between said semiconductor pellets, and
   wires for connecting said plurality of semiconductor pellets and said insulating substrate therebetween,
   said insulating substrate being fixed on said bed by an insulating adhesive agent including, as a filling material, particles of silicon dioxide and metal particles of which surfaces are coated with an oxide film.

2. A semiconductor device as set forth in claim 1, wherein said metal is nickel-chromium steel.

3. A semiconductor device as set forth in claim 1, wherein particles of said metal has a size smaller than that of particles of said silicon dioxide.

4. A semiconductor device as set forth in claim 1, wherein said metal particles are circular.

5. A semiconductor device as set forth in claim 1, wherein said metal particles are in the form of flakes.

* * * * *